United States Patent [19]

O'Connor et al.

[11] Patent Number: 5,552,638

[45] Date of Patent: Sep. 3, 1996

[54] METALLIZED VIAS IN POLYIMIDE

[75] Inventors: Loretta J. O'Connor, Westford; Rosemary A. Previti-Kelly, Richmond; Thomas J. Reen, Essex Junction, all of Vt.

[73] Assignee: International Business Machines Corporation, Armonk, N.Y.

[21] Appl. No.: 349,350

[22] Filed: Dec. 5, 1994

Related U.S. Application Data

[62] Division of Ser. No. 38,407, Mar. 29, 1993, Pat. No. 5,397,741.

[51] Int. Cl.⁶ .................. H01L 21/465; H01L 21/283
[52] U.S. Cl. .................. 257/759; 257/643; 257/791; 257/792; 257/752; 257/753; 257/773; 257/774; 257/760
[58] Field of Search ................... 257/643, 759, 257/792, 752, 753, 40, 791, 774, 773, 760

[56] References Cited

U.S. PATENT DOCUMENTS

| | | | |
|---|---|---|---|
| 4,030,948 | 6/1977 | Berger | 148/33.3 |
| 4,349,609 | 9/1982 | Takeda et al. | 428/429 |
| 4,430,153 | 2/1984 | Gleason et al. | 156/643 |
| 4,600,685 | 7/1986 | Kitakohji et al. | 430/313 |
| 4,626,556 | 12/1986 | Nozue et al. | 522/99 |
| 4,723,978 | 2/1988 | Clodgo et al. | 65/31 |
| 4,944,836 | 7/1990 | Beyer et al. | 156/645 |
| 4,954,142 | 9/1990 | Carr et al. | 51/309 |
| 4,981,530 | 1/1991 | Clodgo et al. | 148/33.3 |
| 5,043,789 | 8/1991 | Linde et al. | 257/40 |
| 5,114,754 | 5/1992 | Cronin et al. | 427/333 |
| 5,114,757 | 5/1992 | Linde et al. | 427/387 |
| 5,194,928 | 3/1993 | Cronin et al. | 257/629 |
| 5,422,223 | 6/1995 | Sachdev et al. | 430/190 |
| 5,451,655 | 9/1995 | Linde et al. | 528/26 |

FOREIGN PATENT DOCUMENTS

| | | | |
|---|---|---|---|
| 0465199 | 1/1992 | European Pat. Off. | 257/759 |

OTHER PUBLICATIONS

Clodgo et al. "Polysiloxane Dielectric for Multi-Level Metal" *IBM Technical Disclosure Bulletin 28* No. 12 (1986).

Baglin et al. "Improving Mechanical and Adhesion Properties of Polyimide-Silicon-Metal Junction" *IBM Technical Disclosure Bulletin 32* No. 9A (1990).

*Primary Examiner*—Robert P. Limanek
*Assistant Examiner*—David Hardy
*Attorney, Agent, or Firm*—Heslin & Rothenberg, P.C.

[57] ABSTRACT

A process for producing a plurality of metallized vias in a polyimide dielectric is disclosed. The process includes depositing a polyimide precursor, then a silane and finally a metal, after patterning the polyimide and silane. The sandwich is heated to completely imidize the polyimide, crosslink the silane and anneal the metal simultaneously. The excess metal overlying the polyimide between the vias is removed by chemical mechanical polishing using the crosslinked silane as a polish stop.

6 Claims, 1 Drawing Sheet

METALLIZED VIAS IN POLYIMIDE

This application is a division, of application Ser. No. 08/038,407, filed Mar. 29, 1993, now U.S. Pat. No. 5,397,741.

FIELD OF THE INVENTION

The invention relates to a process for forming metallized vias in a polyimide layer on a substrate. The process is useful for the fabrication of Semiconductor devices. The invention also relates to semiconductor devices having metallized polyimide layers and a silsesquioxane layer overlying them.

BACKGROUND OF THE INVENTION

In the later steps of IC chip fabrication, it is common to wire the device by creating an appropriate pattern of metallic conductors separated by a low dielectric insulator on the surface of the chip. The lower the dielectric constant of the insulator, the more densely the wiring can be packed without compromising electrical integrity. Because of its low dielectric constant and its convenience in fabrication processes, polyimide has become a material of choice.

A particularly attractive process for metallization of the preferred polyimide dielectric would include the deposition of the polyimide layer and patterning with a series of trenches followed by the deposition of a suitable highly conductive metal in the trenches to form the connections. In a particular and advantageous application of this process, the metal would be copper or a copper alloy and would be deposited by evaporation or sputtering. The excess metal overlying the polyimide between the trenches would then be removed by chemical-mechanical polishing (CMP) back to the polyimide. (See FIGS. 1 to 4.)

Unfortunately, the theoretically attractive process described above does not work in practice. There are two problems, both of which arise from CMP: (1) the copper is pulled out of the trenches by the CMP and (2) the surface of the polyimide is badly scored by the CMP. One way around the problems is to replace polyimide by a different dielectric such as silicon oxide or nitride. Copper is then less prone to being pulled out of the trench because it adheres better, and the oxide or nitride is less prone to mechanical damage by CMP. One drawback is that the dielectric constants of oxide and nitride are significantly higher than that of polyimide. This drawback could possibly be overcome by depositing a layer of polyimide and then coating the polyimide with oxide or nitride, but the deposition of oxide or nitride is done at temperatures that render polyimide an unattractive substrate because of outgassing and decomposition in the deposition tool. Moreover, there is very high stress between a polyimide and an oxide or nitride layer, so that the layers tend to crack and fail.

Thus there is a need for a process whereby a metallization can be dependably and reproducibly patterned in a polyimide layer.

There is a further need for a process that allows CMP of a metal that has been deposited on a polyimide substrate.

SUMMARY OF THE INVENTION

It is an object of the present invention to provide a process whereby a metal can be dependably and reproducibly patterned in a polyimide layer.

It is a further object to allow CMP on a metal deposited on a polyimide substrate.

These and other objects, features and advantages are realized in the present invention, which in one aspect relates to a process for producing a plurality of metallized vias in a polyimide layer on a substrate comprising the steps of:

(a) applying a solution of a polyimide precursor in an inert solvent to the substrate;

(b) heating, in a first heating cycle, the solution of polyimide precursor at a combination of temperature and pressure sufficient to volatilize the inert solvent but insufficient to completely convert the polyimide precursor to polyimide. The first heating cycle is continued for a period of time at least sufficient to provide a mechanically stable layer;

(c) applying a solution containing a polyaminoalkylalkoxysilane (PAAS) in an inert, nonaqueous solvent to the mechanically stable layer of polyimide precursor. A preferred genus of polyaminoalkylalkoxysilane has the formula

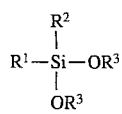

wherein $R^1$ is hydrogen or alkoxy of one to four carbons, $R^2$ is a linear, branched or cyclic polyaminoalkyl residue of one to eleven carbons, five to 26 hydrogens and two or three nitrogens and $R^3$ is aryl or alkyl of one to four carbons;

(d) heating, in a second heating cycle, the solution of a PAAS at a combination of temperature and pressure sufficient to volatilize the inert solvent but insufficient to completely imidize the polyimide precursor and insufficient to cleave a significant portion of the amino functions in the PAAS. The second heating cycle is continued for a period of time at least sufficient to provide a mechanically stable silane layer;

(e) patterning both of the layers with a plurality of trenches;

(f) depositing sufficient metal to at least fill the trenches;

(g) heating, in a third heating cycle, the whole stack at a temperature and for a time sufficient to completely imidize the polyimide and to convert the silane layer to a silsesquioxane polymer layer; and (h) chemical-mechanical polishing the substrate to remove all of the metal outside the trenches, using the layer of silsesquioxane as a polish stop.

First and second heating cycles are optimally carried out at from 100° to 200° C., and the third heating cycle is optimally at from 350° to 450° C. In a preferred process, the polyimide precursor is a polyamic acid and the metal is copper or an alloy of copper. A preferred PAAS is N-[3-(trimethoxysilyl)propyl]-1,2-ethanediamine. The silsesquioxane layer is preferably from 200 to 500 Å thick.

The solution containing a PAAS may also contain one or more organosilicon compounds selected from the group consisting of arylalkoxysilanes and arylsilazanes. A preferred solution containing a PAAS consists essentially of a 1 to 5% solution of N-[3-(trimethoxysilyl)propyl]-1,2-ethanediamine plus phenyltriethoxysilane. Throughout the text that follows, substituents are defined when introduced and retain that definition whenever they appear subsequently.

In another aspect the invention relates to a process for producing a plurality of metallized vias in a preformed polyimide layer on a substrate comprising the steps of:

(a) applying a solution containing a PAAS in an inert, non-aqueous solvent to the polyimide layer;

(b) heating, in a first heating cycle, the solution of a PAAS at a combination of temperature and pressure sufficient to volatilize the inert solvent but insufficient to cleave a significant portion of the amino functions in the PAAS. The first heating cycle is continued for a period of time at least sufficient to provide a mechanically stable silane layer;

(c) patterning both layers with a plurality of trenches;

(d) depositing sufficient metal to at least fill the trenches;

(e) heating, in a second heating cycle, the metal, silane and polyimide at a temperature and for a time sufficient to convert the silane layer to a silsesquioxane polymer layer; and (f) chemical-mechanical polishing the substrate to remove all of the metal outside the trenches using the layer of silsesquioxane as a polish stop.

Preferred materials and conditions are as before.

In another aspect the invention relates to a process for producing a plurality of metallized vias in a polyimide layer, having an upper and lower surface, comprising providing a 200 to 500 Å thick layer of a silsesquioxane on the upper surface of the polyimide layer and using the silsesquioxane layer as a polish stop. The silsesquioxane layer is derived at least in part from a polyaminoalkylalkoxysilane (PAAS). The polish stop allows chemical mechanical polishing for removing metallization deposited on the silsesquioxane layer while leaving metallization deposited in a plurality of recessed structures in the polyimide layer. Upper and lower, as used in the sense above, refer not to orientation with respect to gravity in an absolute sense but orientation with respect to gravity when the chip is in its normal orientation, i.e. substrate 8 on the bottom. Thus the "lower" surface is the surface in contact with the substrate.

In another aspect the invention relates to semiconductor devices having metallized vias made by the foregoing processes, and particularly to a layered semiconductor device comprising:

(a) at least one layer of polyimide, which has a plurality of metallic inclusions; and (b) a 200 to 500 Å thick layer of a silsesquioxane, derived at least in part from a diaminoalkyltrialkoxysilane (PAAS), overlying the layer of polyimide.

DETAILED DESCRIPTION OF THE INVENTION

Figure 1:
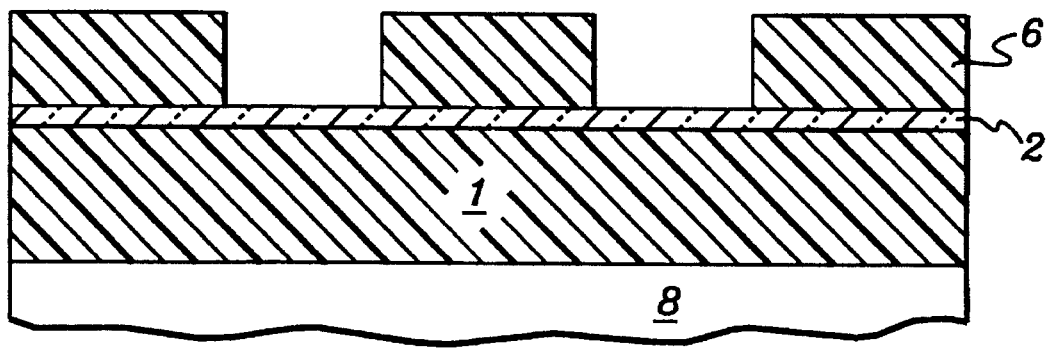
FIGS. 1 to 4 are sequential schematic diagrams of a cross-section of a device fabricated by the process of the invention.
Figure 2:
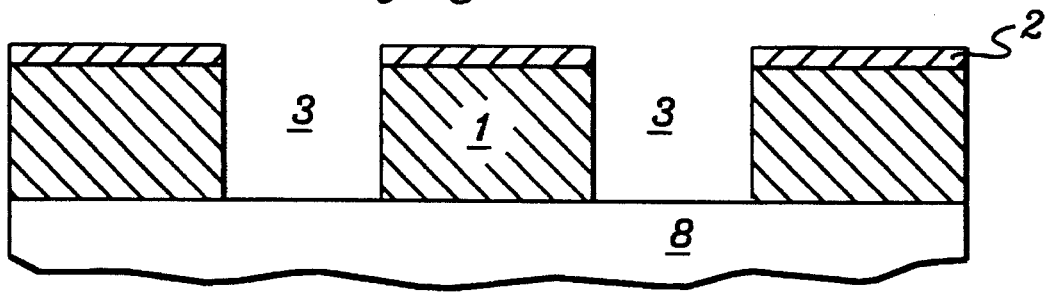

As shown in FIGS. 1 to 4 the process of the invention allows one to create metallized vias in a polyimide layer 1 by overcoating with a silsesquioxane 2, patterning the polyimide and silsesquioxane to provide trenches 3, depositing metal 4, and CMP planarizing back to the silsesquioxane layer 2. The process has a number of advantages, particularly in that the silsesquioxane can be applied by a simple process, such as spin coating, which is compatible with polyimide deposition processes. In addition, the resulting silsesquioxane layer has mechanical properties very similar to those of polyimide so that cracking and delamination are not problems.

According to the process of the invention, the polyimide may be preformed or can be deposited and partially cured. Suitable polyimide precursor materials include polyamic acid polymers which are based on the condensation of aromatic dianhydrides with diamines, more preferably aromatic diamines, and the corresponding polyamic ester polymers. Suitable aromatic dianhydrides include pyromellitic dianhydride, 2,2-bis(3,4-dicarboxyphenyl)propane dianhydride, 2,3,6,7-naphthalenetetracarboxylic dianhydride, 2,2'3,3'-diphenyltetracarboxylic dianhydride, and benzophenone tetracarboxylic dianhydride. Suitable diamines include m-phenylene diamine, p-phenylene diamine and 4,4'-diaminophenyl ether. Illustrative polyimide precursor materials useful for the purposes of this invention and their methods of preparation are disclosed in U.S. Pat. Nos. 3,179,614, 3,264,250 and 4,612,210, the disclosures of which are incorporated herein by reference. Particularly preferred polyamic acid polymers are available from E. I. dupont deNemours and Company, Wilmington, Del., under the trade designation "PI-5810", "PI-2545" and "PI-2525".

Typically, the polyimide precursor is dissolved in a suitable inert solvent, and then the solution is applied to the substrate by spin coating, at a spin speed of about 1000–7000 rpm, depending upon the desired thickness. The solvents are not unduly limited, and a number of solvents or solvent mixtures can be used, for example, N-methylpyrrolidinone (NMP), dimethylacetamide (DMAc), dimethylformamide (DMF), dimethylsulfoxide (DMSO) or suitable mixtures of these solvents with various conventional hydrocarbon solvents.

After applying the solution, the surface is heated to drive off solvent from the polyimide precursor material. The actual heating conditions, i.e. temperature, pressure and time, may vary over wide ranges and are generally dependent on the monomers employed in the organic solution and their molar ratios, the polyimide precursor material employed, the desired thickness of the cured layers being produced, as well as other factors which are apparent to those skilled in the art. Typical thickness would be from 0.5 to 2.0 μm. In general, temperatures below 200° C., for a period of about 15–60 minutes at atmospheric pressure provide a mechanically stable polyimide layer. By "mechanically stable" is meant that the layer does not creep and does not alter dimension or release gases on further processing. Outgassing is a particular concern because it causes delamination of metal layers.

In a preferred embodiment, the heat treatment is performed in a series of steps at atmospheric pressure. In this manner, the substrate is exposed to a temperature of about 85°–160° C., or sequential temperatures within that range, to drive off solvent.

In some instances it may be desirable to completely cure the polyimide layer before depositing the silsesquioxane precursor solution. This can be accomplished by heating to 350° to 450° C. to form the polyimide polymer from the polyamic acid. The process of cyclization of polyamic acid or ester precursors to polyimide is referred to as "imidizing". Completely imidizing before converting the silane to silsesquioxane polymer is generally less advantageous than the simultaneous, final curing of polyimide and silsesquioxane described below, and in a preferred process less than 80% of the polyamic acid is imidized during volatilization of the solvent.

After the polyimide precursor layer has been deposited and made stable, the silane layer is deposited, preferably by spin-coating at 500 to 10000 rpm, depending on the thickness of the desired layer. For the purposes of the invention, layers 200 to 500 Å in thickness are optimal. Copolymers can be made by including, in addition to the PAAS, an arylalkoxysilane or arylsilazane. The silane can be coated as a 1 to 5% solution in an inert, organic solvent. Aminoalkylsilanes are known for use as adhesion agents between polyimide and oxide substrates, but in the art they are not used as discrete layers of measurable thickness. Such aminoalkylsilanes are used as 0.1% solutions to produce monolayers.

Any suitable solvent which can dissolve the PAAS and the arylalkoxysilane or arylsilazane can be employed. Typical solvents include, for example, alcohols, such as methanol, ethanol, propanol, isopropanol, butanol, isobutanol, isoamyl alcohol, and the like; ethers, such as the cellosolves, e.g. methyl cellosolve, diglyme, dioxane, butyl carbitol, tetrahydrofuran, and the like; aromatic alcohols, such as phenol, and the like; polyhydric alcohols, such as ethylene glycol, tetramethylene glycol, and the like; ketones, such as methyl ethyl ketone, methyl isobutyl ketone, diethyl ketone, and the like; etc., as well as mixtures thereof, as will be apparent to those skilled in the art. Preferred solvents include methanol, ethanol and isopropanol.

The PAAS is of the genus

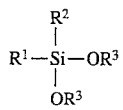

wherein $R^1$ is hydrogen or alkoxy of one to four carbons, $R^2$ is a linear, branched or cyclic polyaminoalkyl residue of empirical formula $C_{1-11}H_{5-26}N_{2-3}$ and $R^3$ is as before. A preferred PAAS is N-[3-trimethoxysilyl)propyl]-1,2-ethanediamine (Registry Number 1760-24-3), also known as N-β-aminoethyl-γ-aminopropyltrimethoxy-silane, which is sold by Union Carbide (Danbury, Conn.) under the designation of Z6020 and by Hüls America (Piscataway, N.J.) under the designation of A0700. Other representative PAAS's include N-β-aminoethyl-γ-aminopropyltris-(β-ethylhexoxy)silane; trimethoxysilylpropyldiethylenetriamine; (aminoethylaminomethyl)phenethyltrimethoxysilane; (aminoethylaminomethyl)phenyltrimethoxysilane; N-(2-aminoethyl)-3-aminopropylmethyldimethoxysilane; and 1,4-bis [3-(trimethoxysilyl)propyl]-ethylenediamine. The important feature for the purpose of the invention appears to be the presence of at least two amino functionalities. Thus when the same process as that of the invention was carried out using the commercially available adhesive 3-aminopropyl-triethoxysilane (ATS) in place of N-[3-(trimethoxysilyl)propyl]-1,2-ethanediamine (a PAAS) there was significant delamination of the metal structures. A working hypothesis is that a minimum of two amino functionalities is required to bind the metal, particularly copper, more tightly and thereby provide better adhesion.

Amine-containing side chains appear to be pyrolytically removed at high temperatures. As these are lost, the sites for binding to the metal significantly decrease; this is the reason for controlling the time and temperature of the baking operations, particularly those that precede metal deposition, so as to preserve as many binding sites as possible. At least half of the amino functions should always remain in the silane after baking and before metal deposition.

Heating the PAAS causes a reaction to produce what appears to be a ladder-type silsesquioxane polymer, although the invention is not to be restricted to this interpretation. So-called "ladder-type" silsesquioxane polymers and copolymers analogous to those of the invention, but made from monoamines in the presence of water, are described in U.S. Pat. No. 4,981,530, the disclosure of which is incorporated herein by reference. The silsesquioxane polymers and precursors of the present invention differ from those of U.S. Pat. No. 4,981,530 in having alkoxyl functionalities in place of hydroxyl and diamine and triamine in place of monoamine side chains.

Preferred optional arylalkoxysilane or arylsilazane monomers that may be added to prepare silsesquioxane copolymers are represented by the formula:

wherein $R^4$ is an unsubstituted or substituted phenyl or benzyl residue. Also, mixtures of such arylalkoxysilanes and arylsilazanes can be used. Representative arylalkoxysilane and arylsilazane monomers include the following: phenyltriethoxysilane, tris(dimethylamino)phenysilane, bis(dimethylamino)diphenylsilane, 4-pyridyltrimethoxysilane and bis(dimethylamino)methyl phenyl silane. Particularly preferred arylalkoxysilane and arylsilazane monomers include those in which $R^4$ is an unsubstituted or substituted phenyl group. Arylalkoxysilane monomers, such as phenyltrialkoxysilane, are most preferred, e.g. phenyltriethoxysilane.

The coated surface is then heated at a temperature which is sufficient to drive off the solvent and form a partially cured layer. It is not necessary to fully cure the layer at this point; in fact, it is only desired to cure the layer to the extent that it has sufficient integrity for patterning and metallization in the next steps. Generally speaking, the temperature will usually range from about 85° to about 200° C., preferably from about 90° to about 180° C., for a time ranging from about 0.5 to about 20 minutes, preferably from about 5 to about 10 minutes. However the actual conditions of partial curing may vary broadly depending upon a number of factors, such as the particular monomers employed in the organic solution, as well as their molar ratios, etc., as should be apparent to those skilled in the art. Generally, it is desirable to remove at least about 90% of the solvent to produce a mechanically stable layer. Baking is preferably done under an inert atmosphere (nitrogen) and must be done in an inert atmosphere if the temperature is above 150° C.

Next, as shown in FIG. 1, a photoresist 6 is deposited, planarized, exposed and developed by procedures well-known in the art. Using the photoresist as a mask, trenches 3 are etched through the polyimide 1 and the silane 2 to the substrate 8, which will commonly include a conductive layer for electrical contact in portions of the vias being produced.

Figure 3:
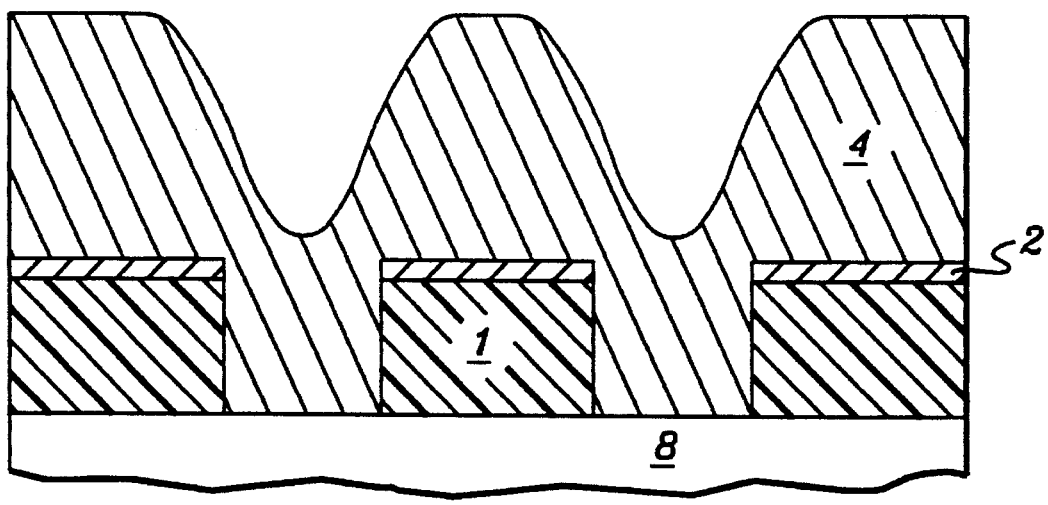

As shown in FIG. 3, a layer of metal 4 is deposited by evaporation, sputtering or other technique compatible with the substrate and stack. For most applications a highly conductive metal such as copper or its alloys will be preferred. However other metals may also be used. Typical metals include transition metals or alloys of transition metals, refractory metals or silicides of refractory metals, etc., for example, copper, aluminum, silver, chromium, lead, tin, gold, the Groups IVA, VA and VIA metals, such as titanium and tungsten, and so forth. Aluminum, nickel and titanium are preferred over such refractory metals as tungsten because they can be deposited at lower temperature.

After deposition the whole stack is heated at sufficient temperature, pressure and duration to cure (or imidize) the polyimide, to form silsesquioxane from the silane layer and to anneal the metal.

Apparently, during the curing step, the copolymer coordinates to the metal through the amino groups. In addition, the copolymer seems to further react with the polyimide precursor to form an amine salt which imidizes in the usual fashion, forming a covalent attachment through the amino groups. In any event, the layer of cured silsesquioxane copolymer provides a strong bond between the polyimide layer and the metal surface. The silsesquioxane from a PAAS has been found to demonstrate excellent mechanical characteristics and desirable electrical properties, such as low dielectric constant, which can be made even lower by increasing the proportion of arylsilane. As a further processing advantage, the adhesion promoting layer is formed without requiring a separate, full curing step.

Figure 4:
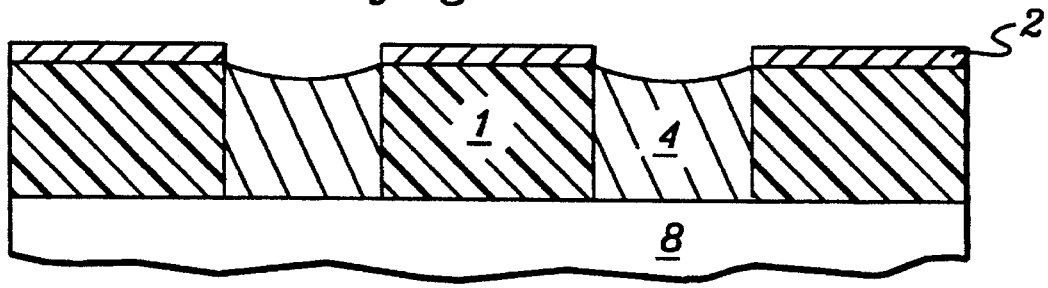

In a final step, as shown in FIG. 4, the excess metal 4 is removed from the surface of the dielectric by CMP. Chemical-mechanical polishing is well-known in the art and is described for example in U.S. Pat. Nos. 4,954,142 and 4,944,836, the disclosures of which are incorporated herein by reference. CMP compositions commonly comprise an abrasive, such as silica or alumina, a surfactant, an antioxidant (to protect the surface of the metal) and a buffer to adjust the pH of the composition for optimum selectivity and efficacy. In the process of the invention, the adhesion between the silsesquioxane 2 on top of the polyimide and metal 4 (see FIG. 3) allows CMP without delamination. When the CMP reaches the surface of silsesquioxane, the silsesquioxane provides a polish stop which protects the surface of the polyimide layer 1 from mechanical damage by the abrasive in the CMP composition. By the time the metal layer is abraded and etched to the level of the top of the trenches, the abrasive can no longer get enough purchase to pull metal out of the trenches and the metallization remains undisturbed despite the absence of a silsesquioxane layer within the trench.

The physical properties of silsesquioxane are particularly advantageous for use in CMP on polyimide because they are well matched to those of polyimide in aqueous environments. (The CMP slurry is water-based.) A traditional oxide would delaminate from the polyimide or would crack because the polyimide absorbs up to 4% water from the CMP slurry during CMP, while oxide does not; the silsesquioxanes of the invention absorb at least as much water as the polyimide and so do not crack or delaminate.

EXAMPLE 1

A conventional monoamine solution (0.1% 3-aminopropyltriethoxysilane in water) was applied to silicon substrate wafers and let stand for 15 sec., then spun at a speed of 3,000 rpm for 30 seconds. The substrates were then heated at a temperature of 100° C. for 10 minutes to remove excess methanol.

Following that, a solution of polyamic acid (11% solids, based on biphenylene tetracarboxylic dianhydride and p-phenylene diamine, commercially available from E. I. dupont deNemours and Company under the designation "PI-5810") in NMP was spin applied at an initial spin speed of 500 rpm for 15 seconds, followed by a final spin speed of 3000 rpm for 30 seconds. The wafers were then baked in air on an 8-position hotplate at temperatures of 95°/105°/105°/115°/115° C. for 2.5 minutes each and then 20 minutes at 135° at ambient pressure. A solution of 2% N-[3-(trimethoxysilyl)propyl]-1,2-ethanediamine in methanol was applied, let stand 15 seconds and spun at 2000 to 4000 rpm for 30 seconds. The wafers were baked at 100° C. for 10 minutes and 185° to 200° for 20 minutes in an inert atmosphere. A photoresist was applied, exposed, developed and baked by a standard process and a series of trenches etched by RIE with 80:20 $CF_4/O_2$ then 100% $O_2$. Copper was deposited by evaporation using a resistively heated source and unheated substrate. The deposition rate was 50 Å/sec at a background pressure of $1\times10^{-7}$ torr. The whole stack was annealed at 400° C. for 45 minutes in an atmosphere of 10:90 $H_2/N_2$. Excess copper was removed by CMP using an aqueous slurry of alumina, antioxidant and surfactant at pH 4.0.

The cured structures were examined visually and tested for resistance and line continuity.

While the invention has been particularly shown and described with reference to preferred embodiments thereof, it will be understood by those skilled in the art that other changes in form and details may be made therein without departing from the spirit and scope of the invention.

We claim:

1. A layered semiconductor device comprising:
   (a) at least one layer of polyimide, said layer of polyimide having a plurality of metallic inclusions; and
   (b) a 200 to 500 Å thick layer of a silsesquioxane, derived at least in part from a polyaminoalkylalkoxysilane (PAAS), overlying said layer of polyimide.

2. The device according to claim 1, wherein said metallic inclusions are substantially free of any silsesquioxane overlying an upper surface thereof.

3. A semiconductor device comprising a metallized via in a polyimide layer prepared by the process of:
   (a) applying a solution of a polyimide precursor in an inert solvent to a substrate;
   (b) heating, in a first heating cycle, said solution of polyimide precursor at a combination of temperature and pressure sufficient to volatilize said inert solvent but insufficient to completely convert said polyimide precursor to polyimide; and continuing said first heating cycle for a period of time at least sufficient to provide a mechanically stable layer;
   (c) applying a solution containing a polyaminoalkylalkoxysilane (PAAS) in an inert, nonaqueous solvent to said mechanically stable layer of polyimide precursor;
   (d) heating, in a second heating cycle, said solution of a PAAS at a combination of temperature and pressure sufficient to volatilize said inert solvent but insufficient to completely imidize said polyimide precursor and insufficient to cleave a significant portion of amino functions in said PAAS, and continuing said second heating cycle for a period of time at least sufficient to provide a mechanically stable silane layer;
   (e) patterning both of said layers of polyimide precursor and silane with a plurality of trenches;
   (f) depositing sufficient metal on said substrate to at least fill said trenches;
   (g) heating, in a third heating cycle, said metal, said silane layer and said polyimide precursor layer at a temperature and for a time sufficient to completely imidize said polyimide and to convert said silane layer to a silsesquioxane polymer layer; and
   (h) chemical-mechanical polishing said substrate to remove all of said metal outside said trenches using said layer of silsesquioxane as a polish stop.

4. A semiconductor device comprising a metallized via in a polyimide layer prepared by the process of:
   (a) applying a solution containing a polyaminoalkylalkoxysilane (PAAS) in an inert, non-aqueous solvent to a polyimide layer;
   (b) heating, in a first heating cycle, said solution of a PAAS at a combination of temperature and pressure sufficient to volatilize said inert solvent but insufficient to cleave a significant portion of amino functions in said PAAS, and continuing said first heating cycle for a period of time at least sufficient to provide a mechanically stable silane layer;

(c) patterning both of said polyimide and said mechanically stable silane layer with a plurality of trenches;

(d) depositing sufficient metal to at least fill said trenches;

(e) heating, in a second heating cycle, said metal, silane and polyimide at a temperature and for a time sufficient to convert said silane layer to a silsesquioxane polymer layer; and (f) chemical-mechanical polishing said substrate to remove all of said metal outside said trenches using said layer of silsesquioxane as a polish stop.

5. A semiconductor device comprising a metallized via in a polyimide layer prepared by the process comprising providing a 200 to 500 Å thick layer of a silsesquioxane, derived at least in part from a polyaminoalkylalkoxysilane (PAAS), on an upper surface of said polyimide layer and using said silsesquioxane layer as a polish stop for removing, by chemical mechanical polishing, metallization deposited on said silsesquioxane layer while leaving metallization deposited in a plurality of recessed structures in said polyimide layer.

6. The device according to claim 5, wherein said metallization in said polyimide layer is substantially free of any silsesquioxane overlying an upper surface thereof.

\* \* \* \* \*